US006553216B1

United States Patent
Pugel et al.

(10) Patent No.: US 6,553,216 B1
(45) Date of Patent: Apr. 22, 2003

(54) RF TUNABLE FILTER ARRANGEMENT WITH TUNABLE IMAGE TRAP

(75) Inventors: Michael Anthony Pugel, Noblesville, IN (US); Gary Dean Grubbs, Indianapolis, IN (US)

(73) Assignee: Thomson Licensing, S.A., Boulogne (FR)

( * ) Notice: Subject to any disclaimer, the term of this patent is extended or adjusted under 35 U.S.C. 154(b) by 0 days.

(21) Appl. No.: 08/572,550

(22) Filed: Dec. 14, 1995

(51) Int. Cl.[7] ................................................. H04B 1/18
(52) U.S. Cl. ...................... 455/340; 455/285; 455/286; 455/287; 455/289; 455/290; 455/195.1; 455/197.3
(58) Field of Search ................................. 455/339, 340, 455/337, 334, 283, 285, 286, 287, 289, 290, 292, 195.1, 196.1, 197.1, 197.2, 197.3, 198.1, 187.1; 331/53

(56) References Cited

U.S. PATENT DOCUMENTS 3,737,801 A * 6/1973 Adams et al. ............... 331/53
4,023,106 A 5/1977 Utsunomiya ............... 325/462
4,361,909 A * 11/1982 Theriault .................... 455/286
4,368,541 A * 1/1983 Evans ....................... 455/185.1
4,399,559 A * 8/1983 Theriault .................... 455/179
4,835,608 A * 5/1989 Lachiw et al. ........... 455/340 X
5,054,117 A 10/1991 Cruz et al. .................. 455/189

* cited by examiner

Primary Examiner—William Trost
Assistant Examiner—Philip J. Sobutska
(74) Attorney, Agent, or Firm—Joseph S. Tripoli; Kuniyuki Akiyama

(57) ABSTRACT

A tuner includes a tunable filter for selecting a desired RF signal in response to a tuning control signal and a tunable image trap for rejecting the undesired image signal corresponding to the desired RF signal responsive to the tuning control signal coupled in cascade between an RF amplifier and a mixer. The tunable trap also serves as an impedance transformation element between the tunable filter and said mixer. The arrangement is particularly useful in a tuner in which the frequency range of the local oscillator signal is below the frequency range of the received RF signals.

14 Claims, 6 Drawing Sheets

RF TUNABLE FILTER ARRANGEMENT WITH TUNABLE IMAGE TRAP

FIELD OF THE INVENTION

This invention concerns a RF filter arrangement useful in a tuner for selecting a desired RF signal while rejecting undesired RF signals, and more particularly with a RF filter arrangement including a trap which rejects the undesired "image" signal associated with the desired RF signal in a tracking relationship as the frequency of the desired signal changes.

BACKGROUND OF THE INVENTION

A tuner of a television or radio receiver includes a mixer which is intended to combine the RF signal corresponding to the desired channel or station and a local oscillator (LO) signal having a frequency corresponding to the desired channel or station to produce an IF output signal. (For the purpose of this application, the terms "channel" and "station" can be used interchangeably, and, therefore, the term "channel" will be used for convenience.) The mixer produces both a difference frequency component (having a frequency equal to the difference between the frequency of LO signal and the frequency of RF signal) and a sum frequency component (having a frequency equal to the difference between the frequency of LO signal and the frequency of RF signal). The difference frequency component is selected and the sum frequency component is removed by an IF filter to produce an IF signal which is ultimately demodulated. Tuners of television and radio receivers typically employ a tunable RF filter which is coupled between the RF input stage and the mixer and which is tuned in a tracking fashion with the local oscillator. The purpose of the tunable RF signal is to select the RF signal corresponding to the desired channel and to remove unwanted RF signals in order to reduce the presence of unwanted mixer products in the IF signal. In modern television and radio receivers, the local oscillator are electronically tuned in response to a tuning signal, usually a voltage.

One type of unwanted RF signal is the so-called "image" signal. An image signal is an RF signal which is offset from the frequency of the LO signal by the frequency of the IF signal, like the desired RF signal, but in the opposite sense to that of the desired RF signal. Viewed another way, the image signal has a frequency which is offset from the frequency of the desired RF signal by a frequency equal to twice the IF frequency. The frequency of the image signal tracks the frequency of the desired RF signal and the LO signal as the channel is changed. The frequency of the image signal can be above or below the frequency for the LO signal depending on whether the frequency of the LO signal is chosen to be higher than or lower than the frequency of desired RF signal. In a conventional terrestrial broadcast or cable tuner, in which the frequency of the LO signal is chosen to be higher than the frequency of the desired RF signal, the frequency of the image signal is higher than the frequency of the LO signal, as is illustrated in FIG. 3A. In a satellite tuner of the type described in copending U.S. application Ser. No. 08/467,097, entitled "Tuner for a Digital Satellite Receiver", filed on Jun. 6, 1995 for M. A. Pugel and K. J. Richter, in which the frequency of the LO signal is chosen to be lower than the frequency of the desired RF signal, the frequency of the image signal is lower than the frequency of the LO signal, as is illustrated in FIG. 3B.

The tunable RF filters employed in tuners are typically bandpass filters. Image signals may be removed or at least reduced in amplitude to the point that they no longer produce objectionable IF responses by employing bandpass filters with so-called "high Q" factors. The "Q" or "quality" factor of a filter refers to the sharpness of the filter or its ability to select only the desired signal or band of signals and to reject unwanted signals very near the desired signal or band of signals. Viewed another way, the "Q" of a filter refers to the slope of the filter response between the "pass" region and the "rejection" region.

A tunable bandpass filter may simply comprise an inductor and a variable capacitor, such as a voltage variable capacitance diode ("varactor" diode). In a typical application, the inductor is connected in parallel with the varactor in what is known as a parallel tuned circuit, and the parallel tuned circuit is connected in-shunt with the path of the signal to be filter. However, such a simple circuit may not be able to adequately reject unwanted signals such as an image signal. A higher Q bandpass filter can be formed by two tuned circuits coupled in cascade. A bandpass filter of the latter type which is commonly employed in tuners comprises two tuned circuits coupled in cascade by virtue of a magnetic coupling between the respective inductors and is known as a doubly-tuned circuit.

In addition to the rejection capabilities of a filter, other considerations are important. It is desirable that the effects of the impedance presented to the filter by a preceding or succeeding processing stage or both be considered. Complexity and its consequential cost are also usually important factors.

SUMMARY OF THE INVENTION

The present invention is based in part on the recognition that a relatively simple filter arrangement which performs the functions of (1) selecting a desired signal, (2) rejecting an unwanted signal having a frequency which tracks that of the desired signal, and (3) impedance transformation can be achieved if a first tunable filter for selecting the desired signal is coupled in cascade with a second tunable filter for rejecting the undesired signal, when at least one of the two tunable filters also serves as an impedance transformation device. Such a filter arrangement is particularly well suited for rejecting the unwanted image signal in a tuning system in which the frequency of the LO signal is lower than the frequency of the desired RF signal so that the frequency of the image signal is lower than that of the desired RF signal. These and other aspects of the invention will be described below with respect to the accompanying Drawing.

Figure 1:
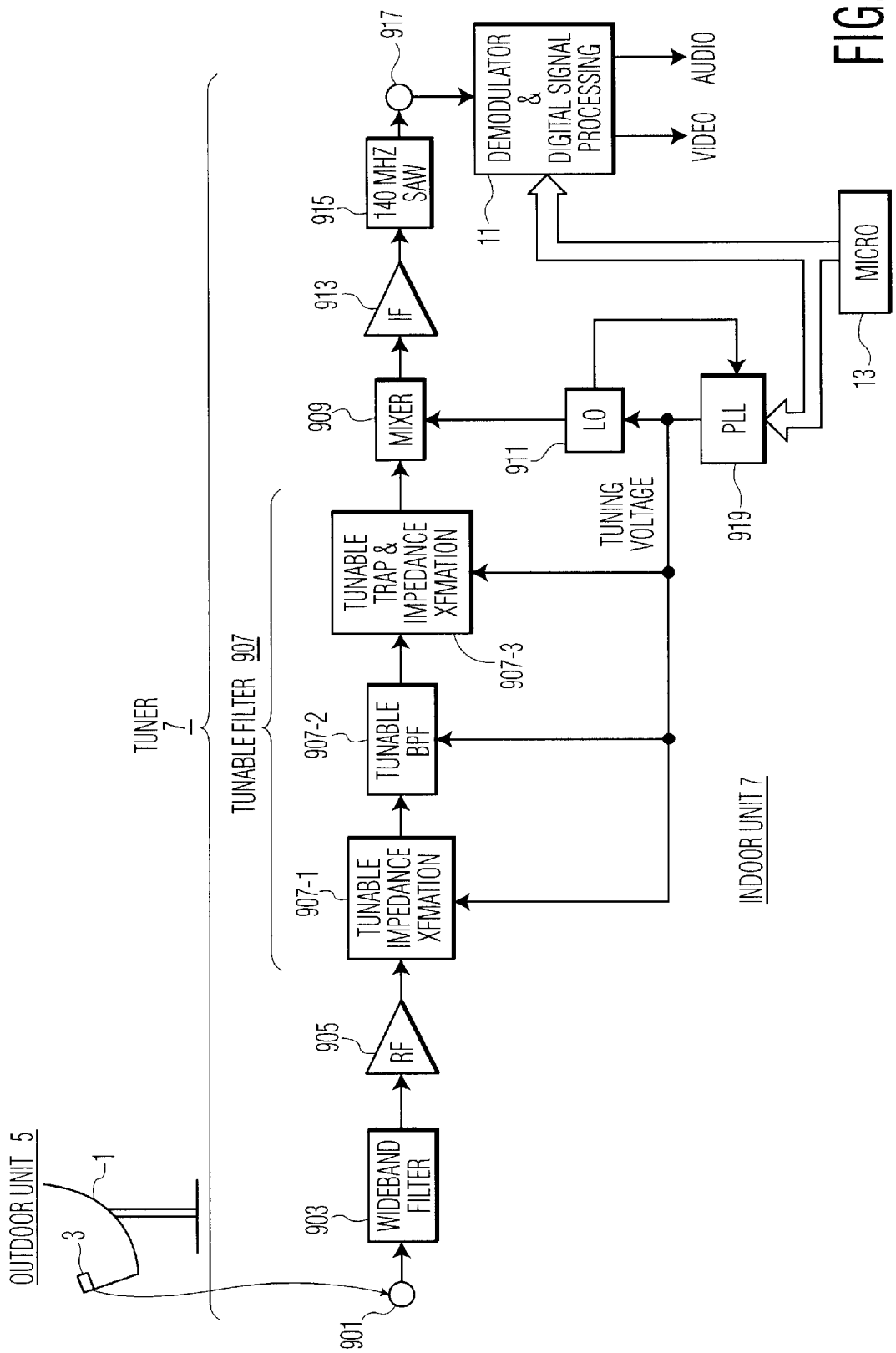
FIG. 1 is a block diagram of a satellite television receiver employing a tuning system constructed in accordance with an aspect of the present invention.

In the various Figures, corresponding elements are identified by the same or similar reference designations. The primed (') reference designation used in FIGS. 7 and 8 indicate functional modifications of corresponding elements shown in FIGS. 1 and 2. The characteristics shown in FIGS. 4, 5 and 6 were derived using computer circuit analysis.

DETAILED DESCRIPTION OF THE DRAWING

The invention will be described with reference to a digital satellite television system in which television information is transmitted in encoded and compressed form in accordance with a predetermined digital compression standard, such as MPEG. MPEG is an international standard for the coded representation of moving picture and associated audio information developed by the Motion Pictures Expert Group. The television information is represented by a series or stream of digital signals organized into packets corresponding to respective video and audio portions of the television information. The digital signals are modulated on to a RF carrier signal in what is known as QPSK (Quaternary Phase Shift Keying) modulation and the RF signal is transmitted to a satellite in earth orbit, from which it is retransmitted back to the earth.

A satellite typically includes a number of transponders for receiving and retransmitting respective modulated RF carriers. In a conventional terrestrial television system, each RF carrier or "channel" contains information for only one television program at a time. Accordingly, to view a program, only the corresponding RF signal needs to be selected. In a digital satellite television system, each modulated RF carrier carries information for several programs simultaneously. Each program corresponds to groups of video and audio packets which are identified by a unique header appended to the packets. Accordingly, to view a program, both the corresponding RF signal and the corresponding packets need to be selected. The DirecTv™ satellite television transmission system operated by the Hughes Corporation of California is such a digital satellite television transmission system.

In the digital satellite television receiving system shown in FIG. 1, RF signals modulated with digital signals representing video and audio information are transmitted by a satellite (not shown) and received by a dish-like antenna 1. The relatively high frequency received RF signals (e.g., in the Ku frequency range between 12.2 and 12.7 gHz) are converted by a block converter 3 to relatively a lower frequency RF signals (e.g., in the L band between 950 and 1450 mHz). Block converter 3 includes a low noise amplifier and is therefore often referred to by the initials "LNB". Antenna 1 and LNB 3 are included in a so called "outdoor unit" 5 of the receiving system. The remaining portion of the receiving system is included in a so called "indoor unit" 7.

Indoor unit 7 includes a tuner 9 for selecting the RF signal which contains the packets for the desired program from the plurality of RF signals received from outdoor unit 5 and for converting the selected RF signal to a corresponding lower, intermediate frequency (IF) signal. A digital signal processing section 11, demodulates, decodes and decompresses the digital information which is QPSK modulated on the IF signal to produce digital video and audio samples corresponding to the desired program, and, thereafter, converts the digital samples to respective analog video and audio signals suitable for reproduction or recording. A microprocessor 13 controls the operation of various sections of indoor unit 7.

The digital satellite television receiver described so far is similar to the RCA™ digital satellite television receiver commercially available from Thomson Consumer Electronics, Inc. of Indianapolis, Ind.

The present invention is concerned with tuner 9. Tuner 9 receives the RF signals provided by LNB 3 at an RF input 901. The RF input signals are filtered by a wideband filter 203, amplified by an RF amplifier 905, and filtered by a tunable filter 907, with which the present invention is specifically concerned and which will be described in detail below. The resulting filtered RF signal is coupled to a first input of a mixer 909. A local oscillator (LO) signal produced by a local oscillator 911 is coupled to a second input of mixer 909. The output of mixer 909 is amplified by an amplifier 913 and coupled to the input of an IF filter 915, comprising a surface acoustic wave (SAW) device. The output of IF filter 915 is coupled to IF output 917 of tuner 9.

Local oscillator 911 is included in a phase locked loop (PLL) arrangement comprising a PLL integrated circuit (IC) 919. The frequency of the LO signal is controlled in response to a tuning control voltage generated by PLL IC 919 in accordance with data generated by a microprocessor 13. The crystal which establishes a frequency reference signal to which the LO signal is compared within PLL IC 919 and the filter network for integrating a pulse type frequency error signal produced by PLL IC 919 as a result of the comparison are not shown for the sake of simplicity.

For cost reasons, it is desirable that tuner 9 have the following three characteristics: (1) comprise only a single conversion stage prior to the IF filter stage; (2) provide an IF signal with a low enough frequency to allow a SAW device to be used for so called "digital symbol shaping", as well as normal IF filtering; and (3) be capable of being constructed utilizing a PLL tuning control IC conventionally used for broadcast and cable receivers. This is accomplished by selecting the center frequency of the IF signal to be in the order 140 mHz and controlling the frequency of the LO signal to be below the frequency of the RF signal for the desired transponder. Other IF frequencies are possible, and, in general terms, the IF frequency may be selected to be in the order of the difference between the highest frequency of the RF signal received from the LNB and highest local oscillator frequency available by utilizing a conventional tuner PLL IC normally utilized in conventional broadcast and cable television receivers. Such a tuner arrangement is described in detail in U.S. patent application Ser. No. 08/467,097 entitled "Tuner of a Digital Satellite Receiver" filed on Jun. 6, 1995 for M. A. Pugel and K. J. Richter, which is assigned to the same assignee as the present application.

Briefly, the relatively low 140 mHz IF center frequency allows a single conversion tuner rather than a more expensive double conversion tuner to be used. It also allows a SAW device which provides so called "digital symbol shaping", as well as normal IF filtering, to be used. In a digital transmission system, it is desirable to perform what is known as "digital symbol shaping" in the transmitter to reduce inter-symbol interference due to transmission bandwidth limitations. It is also desirable to perform digital filter shaping in the receiver to complement the digital filter shaping performed in the transmitter. It is also desirable that the IF filter provide for symbol shaping, as well as the normal IF filtering function, so that a separate digital filter not be required. By way of example, what is known in the digital filter arts as a "root raised cosine" response is suitable for digital symbol shaping. Such a SAW filter is described in detail in U.S. patent application Ser. No. 08/467,095 entitled "SAW Filter for a Tuner of a Digital Satellite Receiver" filed on Jun. 6, 1995 for K. J. Richter, M. A. Pugel and J. S. Stewart, which is assigned to the same assignee as the present application.

In addition, with an IF center frequency of 140 mHz and a RF input frequency range between 950 and 1450 mHz, the LO frequency range is between 810 and 1310 mHz. The 810–1310 mHz frequency range of the LO signal permits PLL tuning control ICs which are conventionally and widely used for broadcast and cable receivers, and therefore relatively inexpensive, to be used rather than a PLL tuning control IC especially designed for satellite receivers. Such a broadcast and cable PLL tuning control IC is the TSA5515T commercially available form Philips Semiconductors and others. The maximum LO frequency available using the TSA5515T and similar ICs is in the order of 1300 mHz, which is adequate.

Figure 3A:
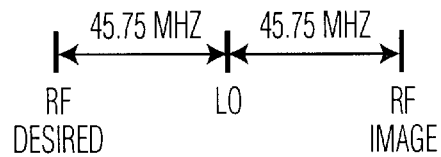
FIGS. 3A and 3B are graphical representations of frequency spectra helpful in understanding a problem solved by the invention.
Figure 3B:
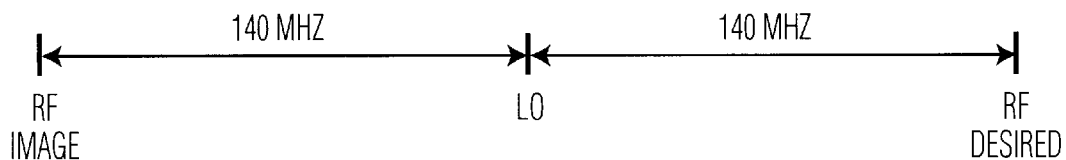

Desirably, tunable filter 907 should select the desired RF signal (i.e., the one for the selected transponder) and reject unwanted RF signals, including the image signal associated with the desired RF signal. As indicated above, the image signal has a frequency which is offset from the frequency of the LO signal for the desired RF signal by the IF center frequency, but in the opposite sense to that of the desired RF signal. The image signal is offset from the frequency of the desired RF signal by twice the IF center frequency. For a tuning system such as the present one in which the LO frequency is below the desired RF signal frequency, the image signal frequency is below the desired RF signal frequency by twice the IF center frequency. More specifically, with respect to the present tuning system in which the IF center frequency is 140 mHz, the image signal frequency is 280 mHz below the frequency of the desired RF signal, as is shown in FIG. 3B. The frequency of the image signal tracks the frequency of the desired RF signal as the frequency of the desired RF signal is changed. It is noted that because the frequency range of the RF signals received by tuner 9 is between 950 and 1450 mHz, the image signals associated with desired RF signals in the frequency range of 1230 mHz (i.e., 950+280 mHz) to 1450 mHz correspond to active RF signals.

Figure 2:
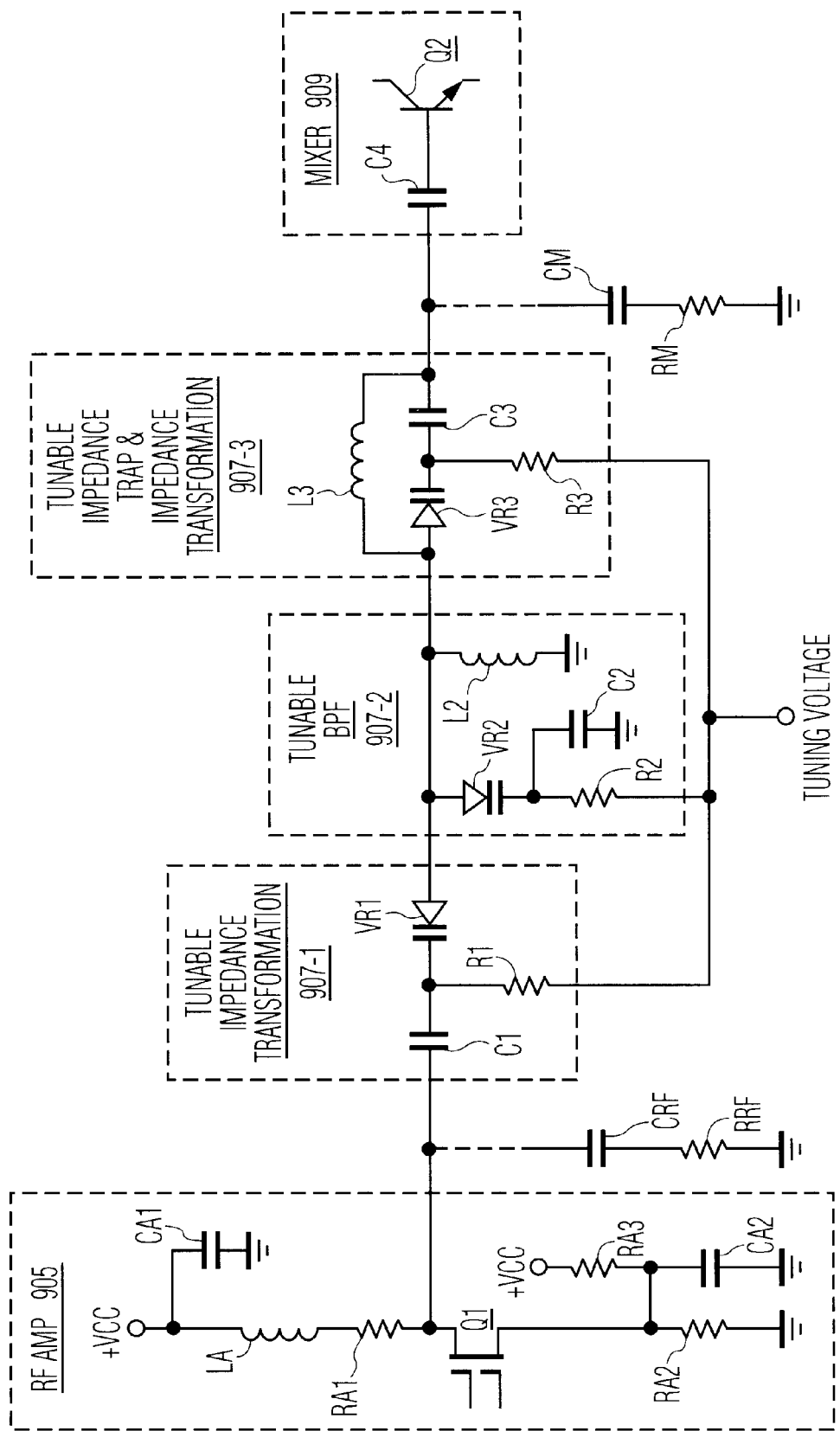
FIG. 2 is a circuit schematic of a preferred implementation of a portion of the tuning system shown in FIG. 1 constructed in accordance other aspects of the invention.

In order select the desired RF signals and reject unwanted RF signals, including the image signals associated with the desired RF signals, in the embodiment of the invention shown in FIGS. 1 and 2, tunable filter 907 includes three sections coupled in cascade: a tunable impedance transformation section 907-1; a tunable bandpass filter (BPF) 907-2; and a tunable trap and impedance transformation section 907-3. Sections 907-1, 907-2 and 907-3 are coupled in cascade in the order named between a first point at the output of RF amplifier 905 and a second point at the input of mixer 909. Each section is controlled in response to the tuning control voltage generated by PLL IC 919 which also controls the frequency of the LO 911.

Figure 4:
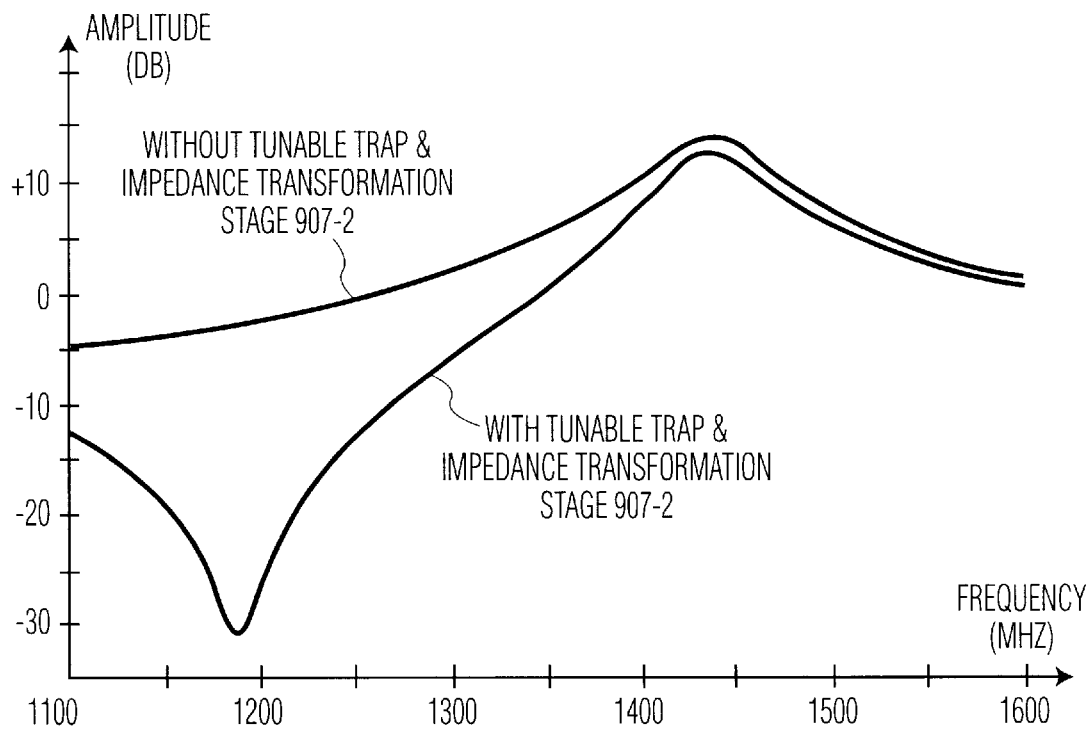
FIG. 4 is a graphical representation of a an amplitude versus frequency response characteristic for a portion of the tuning system shown in FIG. 1 and the implementation shown in FIG. 2.

As is shown in FIG. 4, tunable BPF 907-2 has a response with relatively flat passband (e.g., 30 mHz) over the bandwidth (e.g., about 24 mHz) of the desired RF signals and allows the desired RF signals to be coupled to mixer 909 with relatively little attenuation. The response of tunable BPF 907-2 rolls off outside of the passband so that unwanted RF signals, including the image signals, are attenuated. The response of tunable BPF 907-2 tracks the LO frequency in response to the tuning voltage.

Tunable stage 907-3 has response with a notch-like rejection band at the image frequency offset (e.g., at or 280 mHz below the desired RF signal frequency) which significantly increases the attenuation of the image signals. The notch-like response of tunable stage 907-3 tracks the passband response of tunable BPF 907-2 in response to the tuning voltage. Advantageously, tunable stage 907-3 also serves as a tunable impedance transformation element which tends to maintain a relatively uniform bandwidth for tunable BPF 907-2 over the tuning range, as will be described in detail below. Section 907-3 is labeled as "TUNABLE IMAGE TRAP & IMPEDANCE TRANSFORMATION" because of its dual purpose feature.

Tunable impedance transformation section 907-1 also tends to maintain a relatively uniform bandwidth for tunable BPF 907-2 over the tuning range, as will also be described in detail below.

Circuit implementations of tunable filter 907 and portions of associated RF amplifier 905 and mixer 909 are shown in FIG. 2.

The output portion of RF amplifier 905 includes a field effect transistor (FET) Q1 in a common source configuration. The output of RF amplifier, taken at the drain of FET Q1, is coupled to tunable impedance transformation stage 907-1.

Tunable impedance transformation stage 907-1 comprises a variable capacitance element including a fixed valued capacitor C1 and a varactor diode VR1 connected in series between the output of RF amplifier 905 at the drain of FET Q1 and tunable BPF 907-2. The tuning- voltage is applied to the cathode of varactor diode VR1 through a resistor R1.

Tunable BPF 907-2 comprises a tunable parallel tuned circuit including an inductor L2 connected in parallel with the series connection of a varactor diode VR2 and a fixed valued capacitor C2. The parallel tuned circuit is coupled in shunt relationship to the signal path between the output of RF amplifier 905 and the input of mixer 909 at the output of tunable impedance transformation stage 907-1, i.e., at the cathode of varactor diode VR1. The tuning voltage is applied to the cathode of varactor diode VR2 through a resistor R2.

Tunable trap and impedance transformation stage 907-3 comprises another tunable parallel tuned circuit including an inductor L3 connected in parallel with the series connection of a varactor diode VR3 and a fixed valued capacitor C3. The parallel tuned circuit is coupled in series relationship with the signal path between the tunable BPF 907-2 and mixer 909. The tuning voltage is applied to the cathode of varactor diode VR3 through a resistor R3.

Mixer 909 comprises a transistor Q2, which for example, may be part of an IC which performs mixer and other functions (such as the local oscillator function) of tuner 9. The μPC2721 IC, commercially available from NEC Corporation of Japan, is such an IC. In that case transistor Q2 is part of what is known the art a as a Gilbert cell arrangement. A discrete (i.e., not within the IC) DC blocking capacitor C4 is coupled between impedance transformation stage 907-3 and the base of transistor Q2.

Exemplary component values for the exemplary circuit implementations shown in FIG. 2 are indicated in the following table:

| FR amplifier 905 | |
| --- | --- |
| supply voltage + VCC | +12 volts |
| inductor LA | choke impedance |
| capacitor CA1 | 100 picofarads (pf) |
| capacitor CA2 | 15 pf |
| resistor RA1 | 47 ohms |
| resistor RA2 | 182 ohms |
| resistor RA3 | 470 ohms |
| tunable impedance transformer 907-1 | |
| capacitor C1 | 2 pf |
| resistor R1 | 100 kilohms (kohms) |
| tunable bandpass filter 907-2 | |
| inductor L2 | 7 nanoHenries 9 (nH) |
| capacitor C2 | 7 pf |
| resistor R2 | 100 kohms |
| tunable trap and impedance transformer 907-3 | |
| inductor L3 | 19 nH |
| capacitor C3 | 10 pf |
| resistor R3 | 100 kohms |
| mixer 909 | |
| capacitor C4 | 100 pf |

In operation, as is indicated in FIG. 4, tunable BPF 907-2 forms a "pole" (maximum) at the frequency of the desired RF signal. The pole region is relatively flat over a passband, e.g., 30 mHz, sufficiently wide with respect to the bandwidth, e.g., 24 mHz, of the desired RF signal. The response rolls off outside of the passband so that signals outside of the passband are relatively attenuated. Unfortunately, the attenuation provided by tunable BPF 907-2 is insufficient at the frequency of the image signal, 280 mHz below the frequency of the desired RF signal in the present embodiment. Tunable trap and impedance transformation stage 907-3 forms a "zero" (minimum) at or near the frequency of the image signal. The added attenuation provided by stage 907-3 ensures that the unwanted image signal is adequately rejected. Due to varactor diode VR3, the zero tracks the pole in response to the tuning voltage.

In addition, the stage 907-3 advantageously prevents the reduction of the bandwidth and therefore a degradation of the rejection capabilities of tunable BPF 907-2. The bandwidth of a parallel tuned circuit, such as that comprising tunable BPF 907-2, at a particular center (pole) frequency, $f_0$, is equal to the ratio of the center frequency and the so-called quality or "Q" factor. Mathematically this relationship is expressed by the following equation:

$$BW = f_0/Q \qquad (1)$$

The Q of a parallel tuned circuit is equal to the ratio of the effective parallel resistance, $R_P$, across it and either its capacitive reactance, $X_C$, or its inductive reactance, $X_L$. Mathematically this relationship is expressed by the following equations:

$$Q = R_P/X_C \qquad (2a)$$

$$Q = R_P/X_L \qquad (2b)$$

The capacitive reactance of a capacitor having a capacitance value of C is given by the mathematical relationship:

$$X_C = \tfrac{1}{2}\Pi f C \qquad (3)$$

The inductive reactance of an inductor having an inductance value of L is given by the mathematical relationship:

$$X_L = 2\Pi f L \qquad (4)$$

Substituting equations 3 and 4 into equations 2a and 2b, and in turn substituting the resulting equations 2 into equation 1, produces the following equations for bandwidth of a tuned circuit having a center frequency $f_0$:

$$BW = \tfrac{1}{2}\Pi C/R_P \qquad (5a)$$

$$BW = f_0^2 2\Pi L/R_P \qquad (5b)$$

Equation 5a is relevant to a tuned circuit, such as the one comprising tunable BPF 907-2, in which the capacitance is changed to change the center frequency. Equation 5a indicates that bandwidth is an inverse function of capacitance C of the tuned circuit, and that if the bandwidth is to remain constant as capacitance C changes with the tuning voltage, then the effective parallel resistance should change in the same manner. More specifically, the numerator of the equation 5a is ½ΠC and is a non-linear function which increases with decreases of capacitance C. Decreases of capacitance C correspond to increases of the center frequency (pole) of tunable BPF 907-2 and increases of the tuning voltage. Accordingly, effective parallel resistance $R_P$, which is the denominator of equation 5a, should increase non-linearly in the same manner as the numerator ½ΠC with increases of frequency and the tuning voltage to maintain a constant bandwidth.

Figure 5:
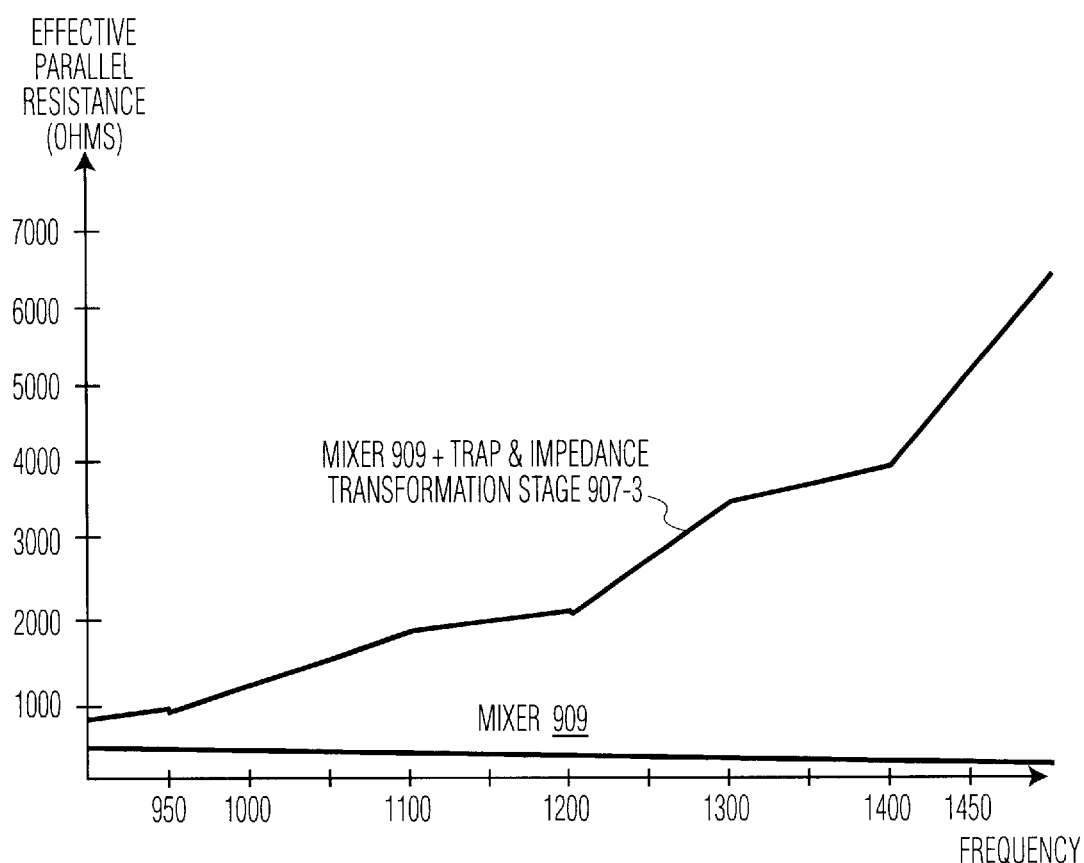
FIGS. 5 and 6 are graphical representations of impedance level versus frequency response characteristics for portions of the implementation shown in FIG. 2.

Without tunable trap and impedance transformation stage 907-3, the impedance presented to tunable BPF 907-2 by mixer 909 comprises a capacitor CM and a resistor RM connected in series between the input of mixer 909 and signal ground, as indicated by the phantom connection in FIG. 2. By way of example, the capacitance of capacitor CM is in the order of 2.5 picofarads, which results from a combination of the capacitance of DC blocking capacitor C4 and the effective capacitance presented by the mixer IC of mixer 909, and the resistance of resistor RM is in the order of 35 ohms. The effective parallel resistance $R_P$ presented by the series combination of capacitor CM and resistor RM as a function of frequency in the frequency range of interest (e.g., between 950 and 1450 mHz) is shown in FIG. 5. As is shown, the effective parallel resistance decreases by about a factor of two over the frequency range of interest.

The total effective parallel resistance presented to tunable BPF 907-2 by mixer 909 with the addition of tunable trap and impedance transformation stage 907-3 is also shown in FIG. 5. It is noted that the total effective parallel resistance is increases non-linearly as a function of frequency. This non-linearly increasing characteristic of total effective parallel resistance $R_P$ compensates for the decreasing characteristic of the effective parallel resistance RP presented by the series combination of capacitor CM and resistor RM. Moreover, it at least approximately tracks the non-linearly increasing characteristic of the ½ΠC numerator term of equation 5a.

The manner in which tunable trap and impedance transformation stage 907-3 performs the impedance transformation function may be understood by recognizing that for frequencies above the trap (zero) frequency, stage 907-3 exhibits a reactance which is dominantly capacitive and that capacitive reactance increases with increases of the tuning voltage and the desired RF signal (pole) frequency. This advantageously results because frequency of the LO signal is below the frequency of the desired RF signal so that the frequency of the image signal falls below the frequency of the desired RF signal.

There is some latitude in choosing the values of the capacitive and inductive portions of the parallel tuned circuit comprising tunable trap and impedance transformation stage 907-3 because the trap (zero) frequency is related to the product of the capacitance and inductance values (more precisely, it is the inversely related to the square root of the product). Accordingly, the combination of varactor diode VR3 and fixed capacitance C3 can be selected for the impedance transformation function and inductor L3 can be selected for the trap function. However, in reality the tuning range of the combination of varactor diode VR3 and fixed capacitor C3 relative to the trap frequency must be also considered. In addition, the notch response of the parallel tuned of stage 907-3 should be relatively narrow (i.e., the parallel tuned circuit should have a high "Q") so as not to affect the bandwidth of tunable BPF 9072, and this limits the selection of the capacitive and inductive portions. Furthermore the capacitance of capacitor C3 should in part be selected to so that the zero frequency tracks the LO frequency. Capacitor C2 of the parallel tuned circuit comprising tunable BPF 907-2 is selected so that the pole frequency tracks the LO frequency.

The frequency of the zero provided by tunable trap and impedance transformation network 907-3 is not always precisely at the frequency of the image signal, e.g., 280 mHz below the frequency of the desired RF signal, over the entire tuning range. For example, as is shown in FIG. 4, when the pole frequency is 1430 mHz, the zero frequency of the zero is at 1180 mHz, or 250 mHz below the pole frequency. This discrepancy from the desired ideal is a result of the practical limitations of the real circuit and compromises discussed above. The discrepancy does not significantly effect the performance of the tuning system. More specifically, it is noted with respect to FIG. 4, that while the zero is at 1180 mHz and not precisely 280 mHz below the pole frequency of 1430, the attenuation at 1150 mHz (which is precisely 280 mHz below the pole frequency of 1430 mHz) is more than adequate.

Figure 6:
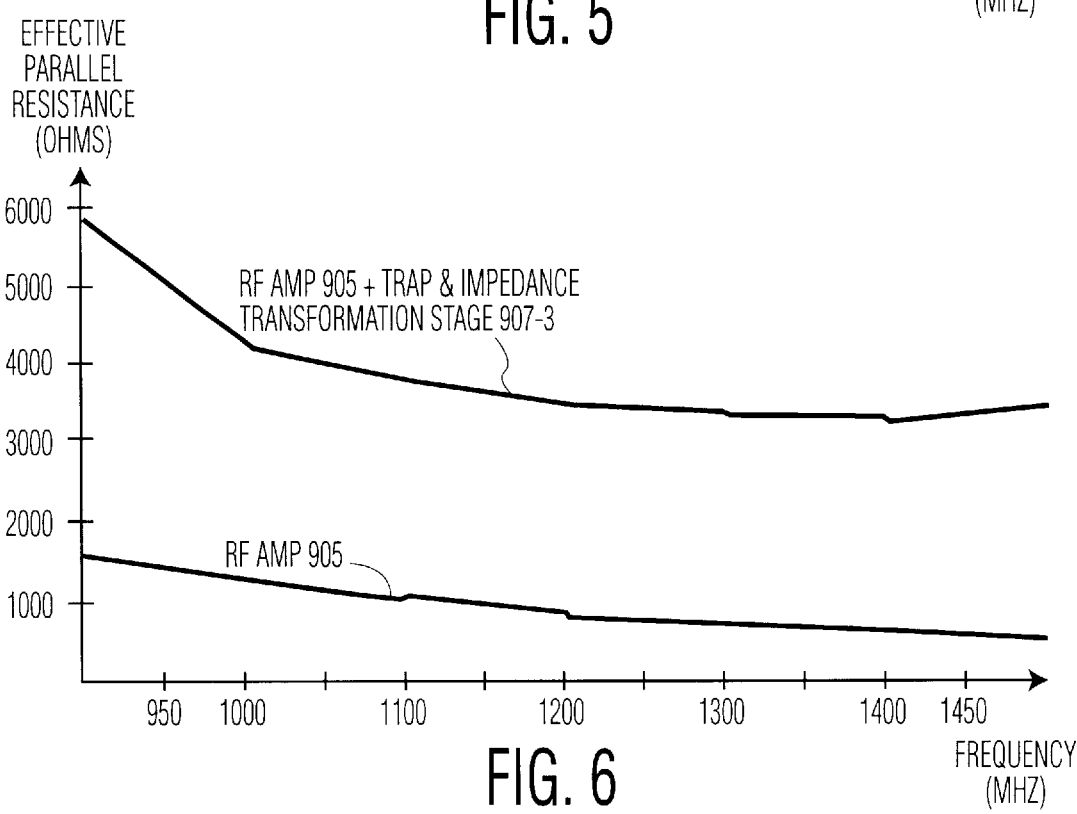

Without tunable impedance transformation stage 907-1, the impedance presented to tunable BPF 907-2 by RF amplifier 905 comprises a capacitor CRF and a resistor RRF connected in series between the output of RF amplifier 905 and signal ground, as indicated by the phantom connection in FIG. 2. By way of example, the capacitance of capacitor CRF is in the order of 1 picofarads and the resistance of resistor RRF is in the order of 20 ohms. The effective parallel resistance presented by the series combination of capacitor CRF and resistor RRF as a function of frequency in the frequency range of interest (e.g., between 950 and 1450 mHz) is shown in FIG. 6. As is shown, the effective parallel resistance is relatively low (lower than 1500 ohms) and decreases by about a factor of two, over the frequency range of interest. This characteristic tends to reduce the bandwidth of tunable BPF 907-2. The total effective parallel resistance presented to tunable BPF 907-2 by RF amplifier 905 with the addition of tunable impedance transformation stage 907-1 is also shown in FIG. 6. It is noted that the total effective parallel resistance is significantly increased (higher than 3000 ohms) over the frequency range of interest. The higher effective parallel resistance tends to maintain the bandwidth of tunable BPF 907-2 over the frequency range of interest.

It will be appreciated by those skilled in the art, that modifications of the tuning system described so far may be made depending on the particular requirements of the tuning system. For example, the tuning system described so far is appropriate for the type of DirecTv™ satellite television transmission system employed in the United States, for which the frequency range of the received RF input signals is between 950 and 1450 mHz. However, for the type of DirecTv™ satellite television transmission system employed in South America, for which the frequency range of the received RF input signals is between 950 and 1700 mHz, it has been found desirable to increase the gain of the RF amplification stage due to a slight reduction of satellite transmission power. An increase in the gain of the RF amplification stage may make it possible to replace tunable impedance transformation stage 907-1 of the tuning system described with respect to FIGS. 1 and 2 with a fixed, impedance transformation stage. Such a modification is indicated in the block diagram of FIG. 7 and described in detail with respect to the circuit diagram of FIG. 8.

Figure 7:
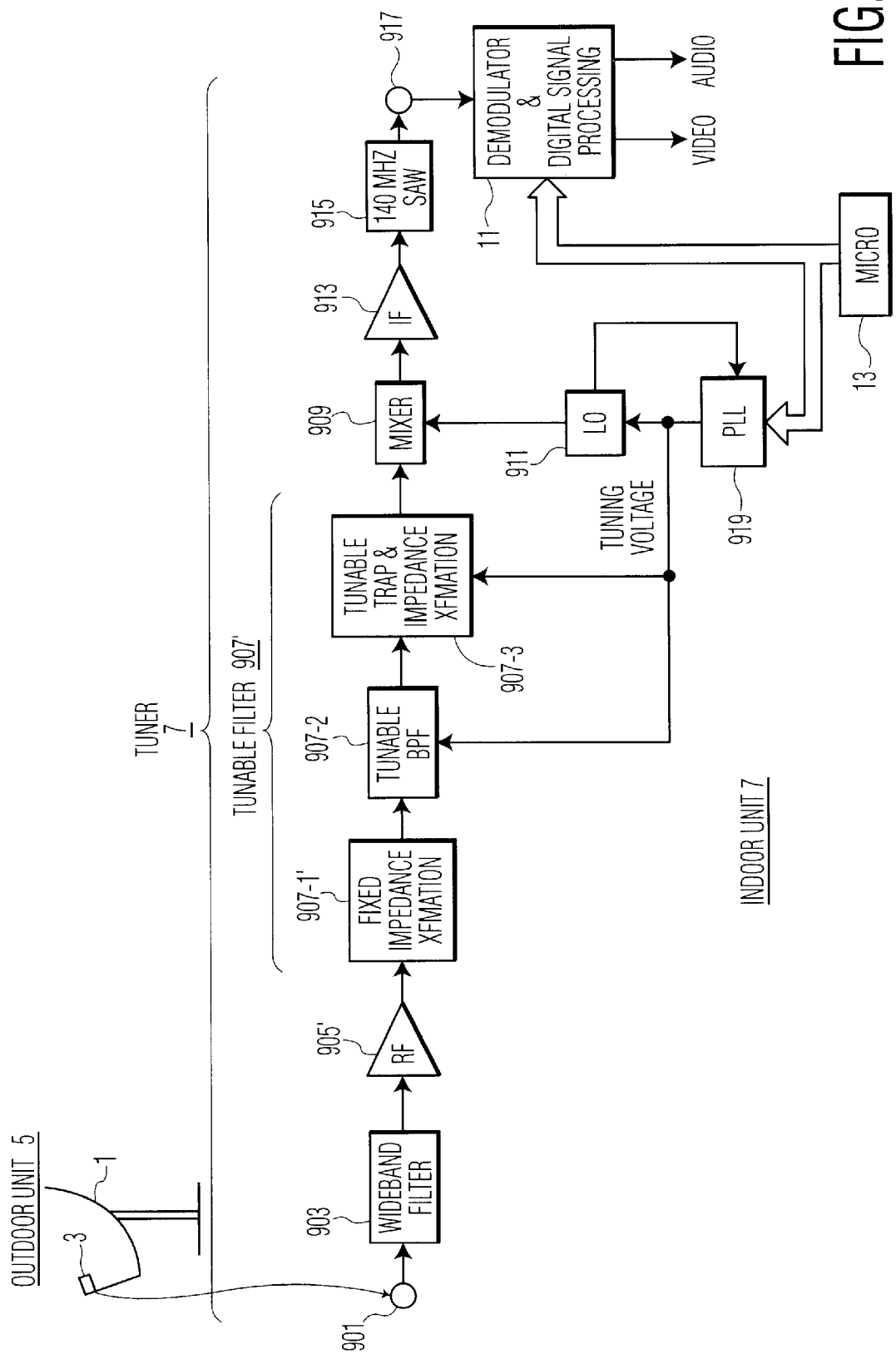
FIG. 7 is a block diagram of the same type of satellite television receiver as shown in FIG. 1 but employing a tuning system which has been modified in accordance with an aspect of the present invention.
Figure 8:
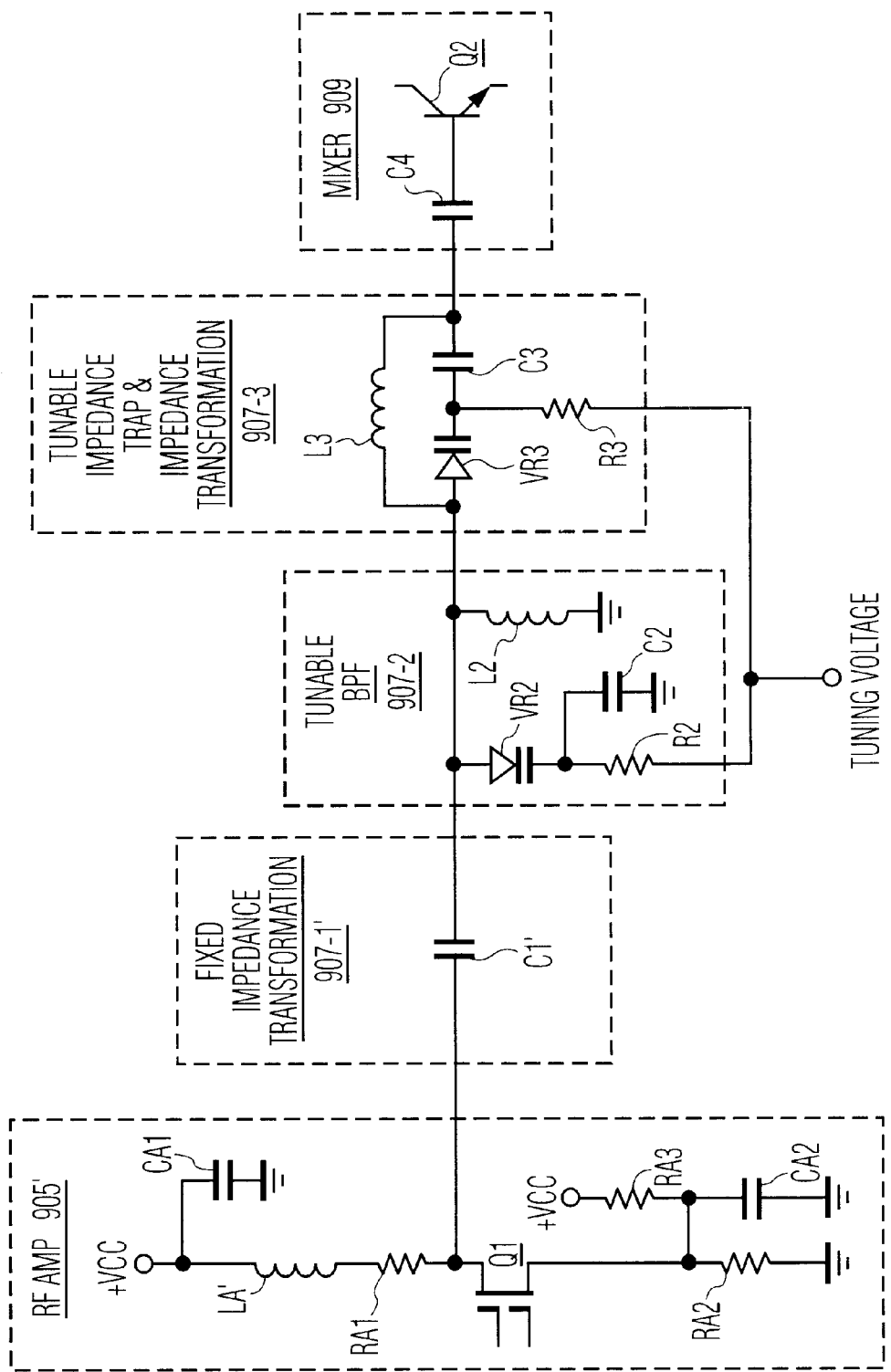
FIG. 8 is a circuit schematic of a preferred implementation of a portion of the tuning system shown in FIG. 7 constructed in accordance an aspect of the invention.

In the FIGS. 7 and 8, the primed (') reference designations, e.g., 905', 907' and 907-1', indicate significant functional modifications of the corresponding elements shown in FIGS. 1 and 2. As will be described below, these functional modification arise due to modification of component values, as will be described below. Although there are other modifications of component values (as indicated in the component value table which appears below), these modifications of component values do not cause a significant functional modification of the respective components and are therefore not indicated by the use of primed (') reference designations but are instead indicated by the use of the same reference designations, which identify corresponding elements shown in FIGS. 1 and 2. The latter component value modifications are due to the wider frequency range (950–1700 mHz compared to 950–1450 mHz) of the RF signals received by the satellite receiver shown in FIG. 7.

As with RF amplifier 905, the output portion of RF amplifier 905' includes a field effect transistor (FET) Q1 in a common source configuration. The output of RF amplifier, taken at the drain of FET Q1, is coupled to fixed impedance transformation stage 907-1'. In RF amplifier 905, an inductor LA in the drain circuit if FET Q1 was used as a RF "choke" to isolate the power supply (+VCC) for the stage. However, in RF amplifier 905', an inductor LA' is used to resonate with the parasitic capacitance at the drain of FET Q1 at 1200 mHz, i.e., at a frequency approximately midway in the 950 to 1700 mHz RF input signal frequency range. The purpose of this resonance is to "tune-out" the parasitic capacitance (e.g., in the order of 1 picofarad) at the drain of PET Q1 to thereby decrease the loading effect due to the parasitic capacitance. A manner in which this "tuning-out" effect can be understood is to recall that in considering the overall impedance of a circuit including an inductor and a capacitor, the inductor and capacitor have impedances with opposite signs (i.e., $j\omega L$ and $-j/\omega C$, respectively) which cancel each other at resonance and which tend to reduce the effect of the other at other frequencies near the resonant frequency. Reducing the loading effect of the parasitic capacitance increases the effective load impedance of FET Q1 and thereby increases the gain of RF amplifier 905'. The increased gain of RF amplifier 905' allows a fixed impedance transformation stage 907-1 to be used instead of tunable impedance transformation stage 907-1, for the following reasons.

Fixed impedance transformation stage 907-1' simply comprises a fixed capacitor C1'. Varactor diode VR1 and resistor R1 of tunable impedance transformation stage 907-1 shown in FIG. 2 have been eliminated. The capacitance of capacitor C1' is low enough (e.g., 0.5 picofarads) that the effective parallel impedance presented to tunable BPF 907-2 by RF amplifier 905' and capacitor C1' is sufficiently high over the tuning range so as to not to significantly reduce the bandwidth of tunable BPF filter 907-2. Although the relatively low capacitance of capacitor C1' tends to reduce the amplitude of the RF signal coupled to mixer 909, this reduction is compensated by the increase in gain of RF amplifier 905'.

Exemplary component values for the exemplary circuit implementations shown in FIG. 8 are indicated in the following table:

| RF amplifier 905' | |
|---|---|
| supply voltage + VCC | +12 volts |
| inductor LA | 13 nanoHenries (nH) |
| capacitor CA1 | 100 picofarads (pf) |
| capacitor CA2 | 47 pf |
| resistor RA1 | 47 ohms |
| resistor RA2 | 182 ohms |
| resistor RA3 | 470 ohms |
| fixed impedance transformer 907-1' | |
| capacitor C1 | 0.5 pf |
| tunable bandpass filter 907-2 | |
| inductor L2 | 12 nH 9 |
| capacitor C2 | 7 pf |
| resistor R2 | 100 kohms |
| tunable trap and impedance transformer 907-3 | |
| inductor L3 | 23 nH |
| capacitor C3 | 12 pf |
| resistor R3 | 100 kohms |
| mixer 909 | |
| capacitor C4 | 100 pf |

While the invention has been described in with respect to embodiments shown in FIGS. 1 and 2 and FIGS. 7 and 8 for particular applications, modifications may be made for different applications. For example, while the invention has been described with respect to two tuning systems which receive RF signals in a frequency range between 950 and 1450 mHz and in a frequency range between 950 and 1700 mHz, respectively, and which utilize an IF center frequency in the order of 140 mHz, the invention is applicable to other tuning systems which receive RF signals in different frequency ranges and which utilize different IF center frequencies. In that regard; the invention is generally applicable whenever the frequency of the LO signal is below that of the desired RF signal. In addition, modifications to the overall architecture tuning may be made depending on the requirements of a particular tuning system. For example, in some applications it may be possible to reverse the order of stages 907-1, 907-2 and 907-3, eliminate the impedance transformation stage altogether or modify tunable impedance transformation stage 907-1 and tunable BPF 907-2 so that a single stage performs both the impedance transformation function and the bandpass filter function. In the latter regard, with reference to FIG. 2, in one possible configuration, varactor diode VR2, fixed capacitor C2 and resistor R2 could be eliminated, leaving fixed capacitor C1, varactor diode VR1, resistor R1 and inductor L2 as a single stage for performing both functions. These and still other modifications are considered to be within the scope of the invention defined by the following claims.

We claim:

1. Apparatus comprising:
   first and second circuit points;
   first and second circuits connected to respective ones of said first point and said circuit point;
   a first tunable filter coupled between said first and second points for selecting a desired signal in response to a tuning signal;
   a second tunable filter coupled between said first tunable filter and said second point for rejecting an unwanted signal having a frequency which tracks the frequency of said desired signal in response to said tuning signal; and
   said second tunable filter also serving as an impedance transformation element at a given tunable RF frequency placed in series between said first tunable filter and said second point.

2. The apparatus recited in claim 1, wherein:
   said second tunable filter has a notch-like response.

3. The apparatus recited in claim 1, wherein:
   said first tunable filter is a bandpass filter.

4. The apparatus recited in claim 1, wherein:
   said first tunable filter is a single-tuned bandpass filter.

5. The apparatus recited in claim 1, further including:
   a fixed impedance transformation stage coupled between said first circuit point and said first tunable filter.

6. Apparatus comprising:
   first and second circuit points;
   first and second circuits connected to respective ones of said first point and second circuit points;
   a first tunable filter coupled between said first and second points for selecting a desired signal in response to a tuning signal;
   a second tunable filter coupled between said first tunable filter and said second point for rejecting an unwanted signal having a frequency which tracks the frequency of said desired signal in response to said tuning signal, wherein
   said second tunable filter serves as an impedance transformation element between said first tunable filter and said second point;
   said first tunable filter includes a first inductive element and a first capacitive element connected as a first parallel tuned circuit; said first parallel tuned circuit being connected in shunt relationship with the signal path between said first and second circuit points; and
   said second tunable filter includes a second inductive element and a second capacitive element connected as a second parallel tuned circuit; said second parallel tuned circuit being connected in series relationship with said signal path between said first and second points.

7. The apparatus recited in claim 6, wherein:
   said first and second capacitive element comprise respective first and second variable capacitance devices responsive to said control signal.

8. Apparatus comprising:
   first and second circuit points;
   first and second circuits connected to respective ones of said first point and second circuit points;
   a first tunable filter coupled between said first and second points for selecting a desired signal in response to a tuning signal;
   a second tunable filter coupled between said first tunable filter and said second point for rejecting an unwanted signal having a frequency which tracks the frequency of said desired signal in response to said tuning signal, said second tunable filter also serving as an impedance transformation element between said first tunable filter and said second point; and
   a controllable impedance transformation stage responsive to said tuning signal coupled between said first circuit point a and said first tunable filter.

9. The apparatus recited in claim 8, wherein:

said controllable impedance transformation stage comprises a variable capacitance device responsive to said control signal.

10. Apparatus comprising:

first and second circuit points;

a signal path coupled between said first and second circuit points;

a first and second circuits connected to respective ones of said first and second circuit points;

a tunable bandpass filter including a first parallel tuned circuit connected in shunt relationship with said signal path for selecting a desired signal in response to a control signal; and a tunable trap including a second parallel tuned circuit connected in series relationship with said signal path for rejecting an unwanted signal having a frequency which tracks the frequency of said desired signal in response to said control signal; said tunable trap also serving as an impedance transformation element between said tunable filter and said second point.

11. The apparatus recited in claim 10, further including:

another impedance transformation element coupled between said first circuit point and said tunable filter.

12. The apparatus recited in claim 11, wherein:

said other impedance transformation element comprises a controllable impedance element responsive to said control signal.

13. The apparatus recited in claim 10, wherein:

said tunable bandpass filter is a singe-tuned stage.

14. The tuning apparatus recited in claim 13, further including:

an impedance transformation stage including a controllable impedance element responsive to said tuning control signal coupled between said output of said RF amplifier and said first tunable filter.

* * * * *